United States Patent [19]

Owens et al.

[11] Patent Number: 5,730,217
[45] Date of Patent: Mar. 24, 1998

[54] VACUUM INSULATED CONVERTER FOR EXTENDING THE LIFE SPAN OF ELECTRONIC COMPONENTS

[75] Inventors: Steve Owens, The Woodlands; Brett Bouldin, Spring; Gary Elliott, Magnolia, all of Tex.

[73] Assignee: PES, Inc., The Woodlands, Tex.

[21] Appl. No.: 667,724

[22] Filed: Jun. 21, 1996

Related U.S. Application Data

[63] Continuation-in-part of Ser. No. 304,698, Sep. 12, 1994, Pat. No. 5,547,028.
[51] Int. Cl.$^6$ .................................................. E21B 36/00
[52] U.S. Cl. ........................... 166/57; 166/64; 166/65.1; 166/302
[58] Field of Search ............................ 166/302, 53, 57, 166/64, 65.1; 62/259.2, 292

[56] References Cited

U.S. PATENT DOCUMENTS

| | | | |
|---|---|---|---|
| 5,265,677 | 11/1993 | Schultz | 166/302 |
| 5,350,018 | 9/1994 | Sorem et al. | 166/66 X |
| 5,547,028 | 8/1996 | Owens et al. | 166/302 |

Primary Examiner—Roger J. Schoeppel

[57] ABSTRACT

A system for extending the life span of electronic components in a high temperature well. A thermal electric cooler is located in a position thermally communicating with the electronic component in the well. The thermal electric cooler lowers the temperature of the electronic component to a temperature that retards the deterioration of the electronic component, and is particularly useful in well completion tools requiring an extended life. A vacuum is maintained about the thermal electric cooler or the electronic components to reduce convection energy losses.

2 Claims, 2 Drawing Sheets

Fig. 3
Fig. 4
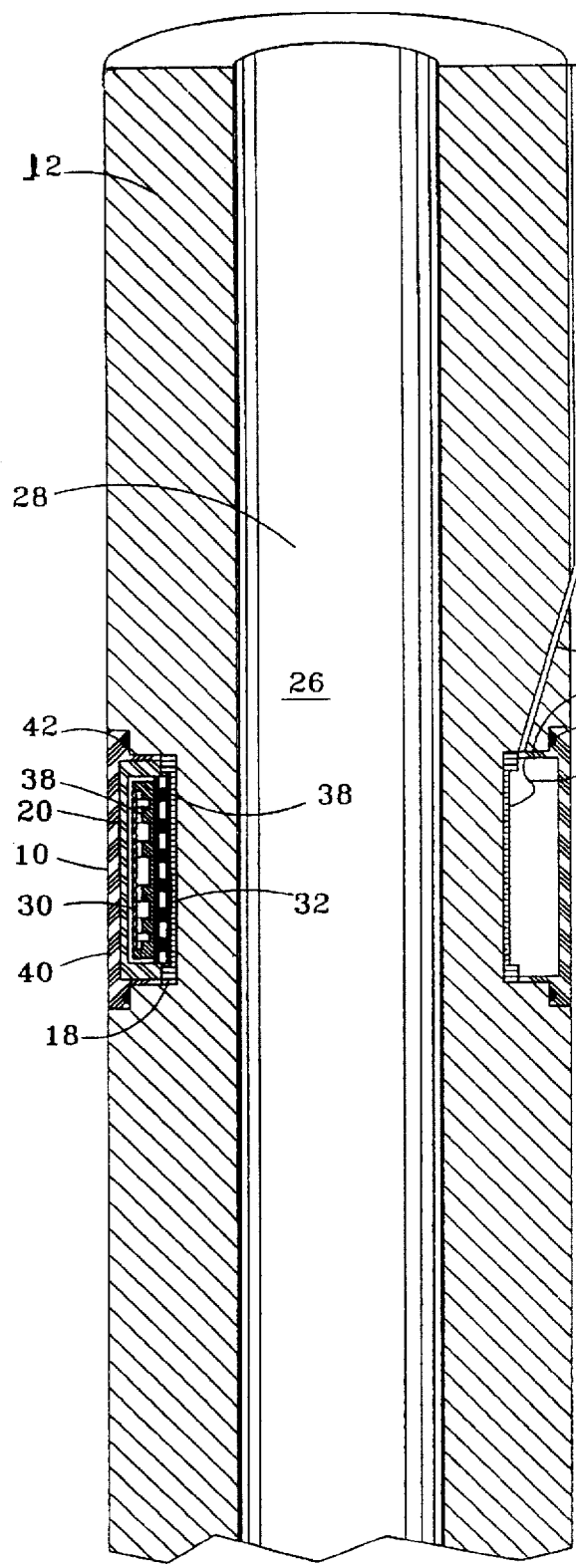
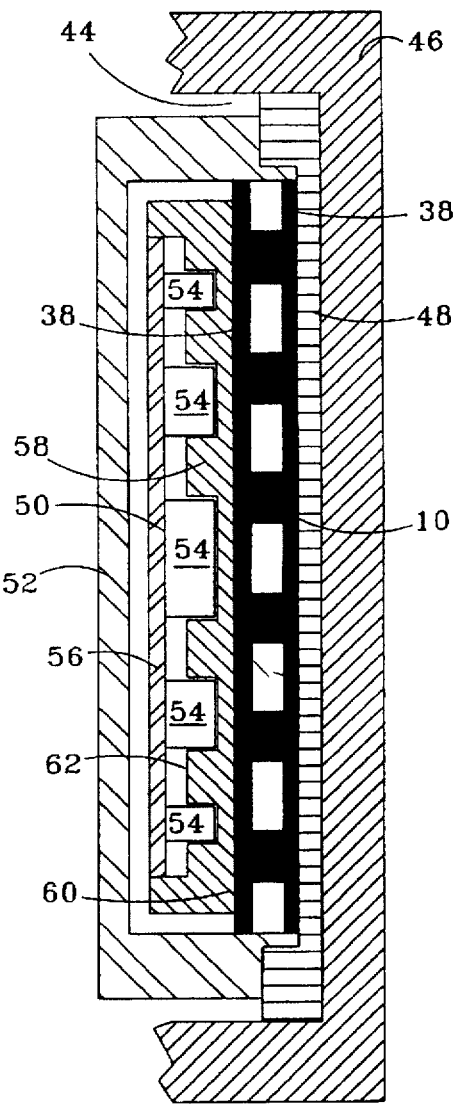

VACUUM INSULATED CONVERTER FOR EXTENDING THE LIFE SPAN OF ELECTRONIC COMPONENTS

This patent application is a continuation-in-part application based on U.S. Ser. No. 08/304,698 filed Sep. 12, 1994, entitled "Downhole System for Extending the Life Span of Electronic Components" now U.S. Pat. No. 5,547,028.

BACKGROUND OF THE INVENTION

The present invention relates to the use of electronic components in a well. More particularly, the present invention relates to a system for extending the life span of downhole electronic components in a well.

The development of hydrocarbon producing wells requires the installation of well completion equipment to monitor and control the flow of fluids. The characteristics of the well are monitored by the completion equipment and are transmitted to the surface. The transmitted data is analyzed by a reservoir management system, and completion equipment such as valves, sliding sleeves, packers, and other completion tools are modified to control the well.

Electronic systems have been incorporated into well completion equipment. However, these downhole electronic systems do not adequately perform for the producing life of the well, which can typically last for ten or more years. When the electronic components in the equipment fail, reservoir management data is interrupted until the equipment is repaired. The repair of such equipment interrupts the operation of the well and increases production cost.

This limitation in the life span of downhole electronic systems is at least partially attributable to elevated temperatures found in certain wells. Downhole well temperatures can exceed 150 degrees Celcius, and these temperatures affect the operation of integrated circuits constructed with electronic components.

Efforts have been made to overcome the limitations of electronic devices at elevated temperatures by using fiber optics. One example is a down hole pressure guage system which does not include downhole electronics. The guage senses pressure through a response created by the change in refractive index of a material in response to pressure variations. This response is measured at the surface by monitoring the changes of an optical signal transmitted from the surface to the downhole guage and back to the surface through a fiber optic cable. While optical systems may be beneficial with certain guage types, optical systems are limited because many well bore characteristics cannot provide a direct optical response. Optical systems are also limited because sufficient power cannot be transmitted through such systems to manipulate downhole mechanical tools for controlling the flow of fluids. Consequently, optical systems cannot provide equivalent functionality to electronic solutions for the downhole processing of information or the regulation of power.

Although systems for extending the life span of electronic components in well completion tools have not been developed, well logging tools have used insulating flasks to shield electronic components from elevated well temperatures. For example, Dewar flasks maintain the electronic components within certain temperature ranges to prevent unstable circuit operation. Although Dewar flasks temporarily insulate the electronic components, the temperature inside the Dewar flask eventually equalizes with the well temperature.

Various concepts to improve the insulating performance of a Dewar flask have been proposed. For example, U.S. Pat. No. 3,265,893 to Rabson et al. (1966) described a well logging tool having a thermally conductive heat sink for stabilizing the temperature in the logging tool for up to twenty hours. U.S. Pat. No. 4,671,349 to Wolk (1987) described a heat transfer wick for cooling the components of a well logging instrument for up to six hours during the interval of greatest heat exposure.

Another concept for improving the performance of a Dewar flask was described in U.S. Pat. No. 3,488,970 to Hallenburg (1970). Electric components were insulated from the well temperature by a Dewar flask, and a pump transported water through a conduit to transfer internally generated heat from the electic components to a water reservoir positioned beneath the Dewar flask. Upper and lower temperature switches controlled the pump operation to heat and cool the Dewar flask within a selected temperature range. A thermoelectric cooling module transferred heat between the water reservoir and the borehole through the logging tool housing. The water reservoir was located at a position away from Dewar flask so that heat transferred by the thermoelectric cooling module was discharged at a position distant from the Dewar flask.

Another concept was described in DOE Technical Note DOE/TIC/EG-85/054 by Bennett entitled *Improved Thermal Protection Apparatus for Electronics*. This proposal used methanol carrying tubes to transfer heat from the electronics to a heat sink of ice so that the electronic components would be protected for up to ten hours at 235 degrees C. Bennett described another concept in a Journal of Energy Resources Technology article entitled *Analytical Approach to Selecting and Designing a Minature Downhole Refrigerator* (December 1992).

None of these concepts describe a system for extending the life span of electronic components in well completion tools. Consequently, a need exists for an apparatus and method which extends the life span of electronic components exposed to elevated temperatures during the production life of a well.

SUMMARY OF THE INVENTION

The present invention provides an apparatus and method for extending the life span of electronic components in a well. The apparatus of the invention is engaged with an electric power source and includes a connecter for engagement with the power source. A converter located with a housing interior space transforms power into thermal energy to create a converter cold surface for cooling the electronic component and to create a converter hot surface for dissipating thermal energy away from the converter. A vacuum is maintained within the interior space to reduce convection energy losses.

BRIEF DESCRIPTION OF THE DRAWINGS

FIG. 3 illustrates the position of one embodiment of the invention in a tubular well tool.

FIG. 4 illustrates an enlarged sectional view of one embodiment of the invention.

DESCRIPTION OF THE PREFERRED EMBODIMENTS

The present invention provides a novel apparatus and method for extending the life span of electronic components located in wells. The invention is particularly useful in well control and monitoring systems that remain downhole for extended periods of time.

The life span of an electronic component is critical to the actual use of the electronic component in a well. The "life span" of an electronic component differs from the "reliability" of the electronic component and more accurately defines the utility of a downhole completion system.

Figure 1:
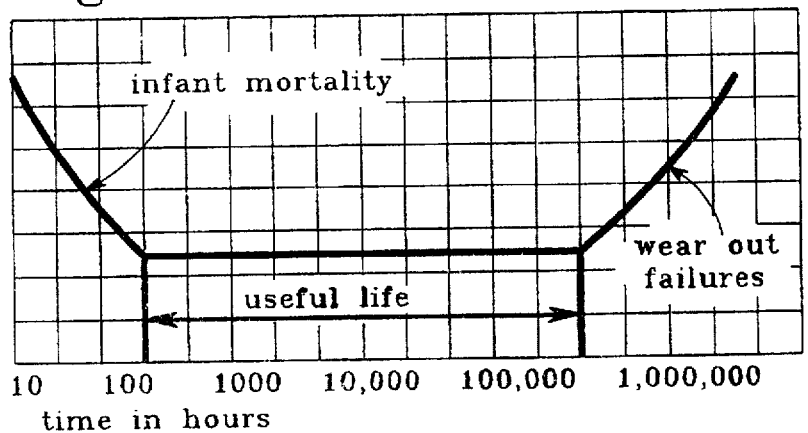
FIG. 1 illustrates a Bathtub curve.

Modern electronic components such as Hi-Rel type components have high reliability. Although such components are extremely reliable, the actual use of a manufactured population of electronic components is hampered by several factors. The statistical analysis for the reliability of an electronic component population can be represented by a "Bathtub Curve" as shown in FIG. 1. The horizontal axis represents time, and the vertical axis represents the failure rate of the electronic component. As used throughout this application, the term "reliability" means the probability that an item will perform its intended function without failure for a specified time period under specified conditions. The Bathtub curve in FIG. 1 also shows that the reliability of a component population changes over time.

FIG. 1 demonstrates that the reliability of a sample population of manufactured components is initially poor. This early period, shown as a period of decreasing failure probability, is known as a period of "infant mortality". Failure due to infant mortality typically occurs because of manufacturing or material flaws. Over time, the reliability of the components approaches a substantially constant level, shown as the middle part of the curve in FIG. 1. This period is termed the period of "useful life" or "life span", and substantially indicates the period of reliable operation.

After the life span period has concluded, "wear out" failures occur. The wear out period of time is characterized by a substantial increase in failure rate plotted against time.

Figure 2:
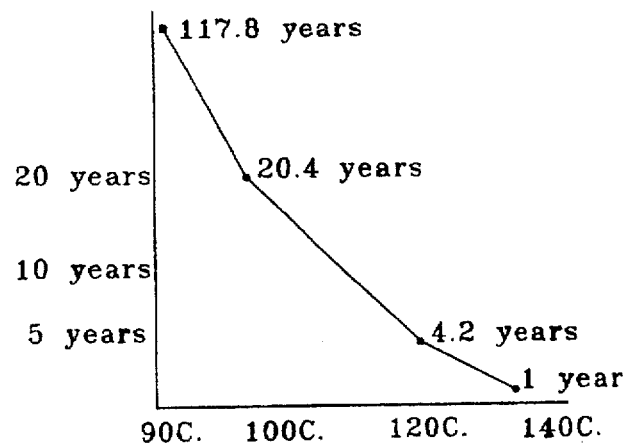
FIG. 2 illustrates the performance of electronic components at different temperatures.

FIG. 2 shows that the "life span" of an electronic component decreases exponentially as temperature increases. This principle is mathematically stated by the Arrhenius equation, and broadly defines the performance of semiconductor devices over time. Because of this relationship, the life span of an electronic component is approximately halved for every ten degrees increase in temperature. Studies have shown that the life span of an integrated circuit population was 117.8 years at 80 degrees Centigrade and was reduced to one year at 140 degrees Centigrade.

The present invention enhances the utility of electronic components in downhole wells by extending the life span of the electronic components in elevated temperature environments. Referring to FIG. 3, converter 10 is illustrated as a thermal electric cooler ("TEC") attached to well tool 12. Connecter 14 is attached to TEC 10 and is further attached to electrified wire 16. To shield TEC 10 from physical damage, TEC 10 is positioned in recess 18 located in tool 12. Electronic component 20 is located proximate to TEC 10 as more fully described below, and connecter 14 extends through aperture 22 of tool 12. Seal 24 prevents reservoir fluids 26 from intruding into recess 18, and reservoir fluids 26 enter the well string at a location (not shown) below tool 12 and travel upwardly through bore 28 through tool 12.

Is the usual operation shown in FIG. 3, TEC 10 has cold surface 30 and hot surface 32. Thermal conductor 34 is positioned between cold surface 30 and electronic component 20 and thermal conductor 36 is positioned between hot surface 32 and tool 12. Thermal grease 38 is positioned between all thermal contact surfaces as illustrated, and enhances the thermal conductivity between such contact surfaces by filling small gaps and irregularities between such surfaces. Cover 40 further protects TEC 10 from impacts and from the intrusion of reservoir fluids 26, and O-ring seal 42 seals the joint between cover 40 and tool 12.

Electronic component 20 is described herein as any electronic or solid state component. Electronic component 20 can comprise any material having a life span less than the design requirements of a well or less than mechanical tool components in a downhole well tool. Alternatively, electronic component 20 can comprise a material that deteriorates when exposed to well temperatures higher than ambient temperature at the surface. As previously noted, the deterioration can be partial or complete and can result in loss of performance or complete failure of the component. Electronic components 10 are typically combined in an integrated circuit to perform a desired task or function, and such electronic components can comprise circuit chips, transistors, resistors, and other components known in the art.

Although the thermal converter is illustrated as TEC 10, thermal converter could comprise any tool or equipment that cools electronic component 20. TEC 10 represents one useful form of converter to perform this function. As known in the art, TEC 10 creates cold surface 30 and hot surface 32 when charged with an electric current. TEC 10 comprises a set of alternately negatively and positively doped semiconductor regions electrically coupled in series and sandwiched between two electrically insulative and thermally conductive layers such as ceramic substrates. As current flows through the semiconductors, heat is conducted from one dielectric layer to the other dielectric layer to create cold and hot surfaces respectively. Additional temperature differential between cold surface 30 and hot surface 32 can be achieved by combining one or more TECs in series wherein first cold surface 30 contacts the hot surface of the second TEC.

As shown in FIG. 3, cold surface 30 is positioned proximate to electronic component 20 so that the cooling effect of cold surface 30 withdraws thermal energy from electronic component. Hot surface 32 is shown in contact with tool 12 so that tool 12 acts as a heat sink to dissipate thermal energy away from TEC 10. If fluid 26 has a temperature less than tool 12 and is moving through bore 28 as shown in FIG. 1, fluid 26 can also facilitate the dissipation of heat from TEC 10.

It will be appreciated that hot surface 32 does not need to be connected to tool 12, and that hot surface 32 can dissipate heat in other ways to remove thermal energy from TEC 10. For example, hot surface 32 could be in contact with fluid 26 within bore 28 or could contact fluid 26 in the annulus between tool 12 and the wellbore. These various embodiments of the invention relate to the thermal efficiency in removing heat away from TEC 10, and further contemplate the use of alternative heat sink designs known in the art.

Referring to FIG. 4, an alternative embodiment of the invention is illustrated. TEC 10 is positioned in recess 44 of tubular flowline 46, and thermal conductor 48 is located between TEC 10 and flowline 46. Printed Circuit Board Assembly ("PCBA") 50 is generally located in recess 44 and is thermally insulated from reservoir fluids 26 with insulated cover 52. Insulated cover 52 increases the cooling efficiency of TEC 10 by reducing the thermal losses caused by convection of air and other elements in contact with PCBA 50.

In another embodiment of the invention, interior space 53 is defined as the volume between cover 52 and flowline 46. PCBA 50 and TEC 10 are positioned within space 53, and a vacuum is created within space 53. The attachment between cover 52 and flowline 46 is sufficiently sealed with techniques known in the art to maintain such vacuum. The presence of a vacuum within space 53 substantially reduces convection energy losses as TEC 10 is operated. Convection energy losses exceed radiation losses and reduce the operating efficiency of TEC 10 in cooling electronic components 54. By substantially eliminating convection losses through the maintenance of a vacuum within space 53, the operating efficiency of TEC 10 increases, and TEC 10 requires less power to cool electronic components 54. In one embodiment of the invention, electronic components 54 can be positioned within space 53 to reduce convection currents circulating around electronic components 54.

As shown in FIG. 4, PCBA 50 includes electronic components 54 of varying configurations and heights (as measured from base 56) to form an irregular profile. Thermal conductor 58 is positioned between cold surface 60 of TEC 10 and includes shaped surface 62 generally configured to mirror the irregular profile of electronic components 54. In this manner, space between shaped surface 62 and electronic components 54 is minimized to improve thermal heat transfer therebetween. In a preferred embodiment of the invention, shaped surface 62 contacts each electronic component 54 to provide thermal conductivity therebetween. This feature permits conductive thermal transfer of energy between shaped surface 62 and electronic components 54 forming an irregularly shaped profile.

In another embodiment of the invention, thermal conductor 58 can comprise a liquid material which solidifies around electronic components 54 to form a conductivity path having an irregular shape. Alternatively, thermal conductor 58 can comprise any material which forms a conductive path between the cold surface of a TEC and one or more components of a PCBA.

As previously described, thermal grease 38 or similar medium can further enhance thermal conductivity. This embodiment of the invention significantly enhances the efficient transfer of thermal energy from PCBA 50 to flowline 46 by using conductive thermal transfer instead of convective thermal transfer. Moreover, this embodiment is significantly more efficient than cooling systems that rely on the circulation of a cooling medium to a remote heat sink.

Figure 5:
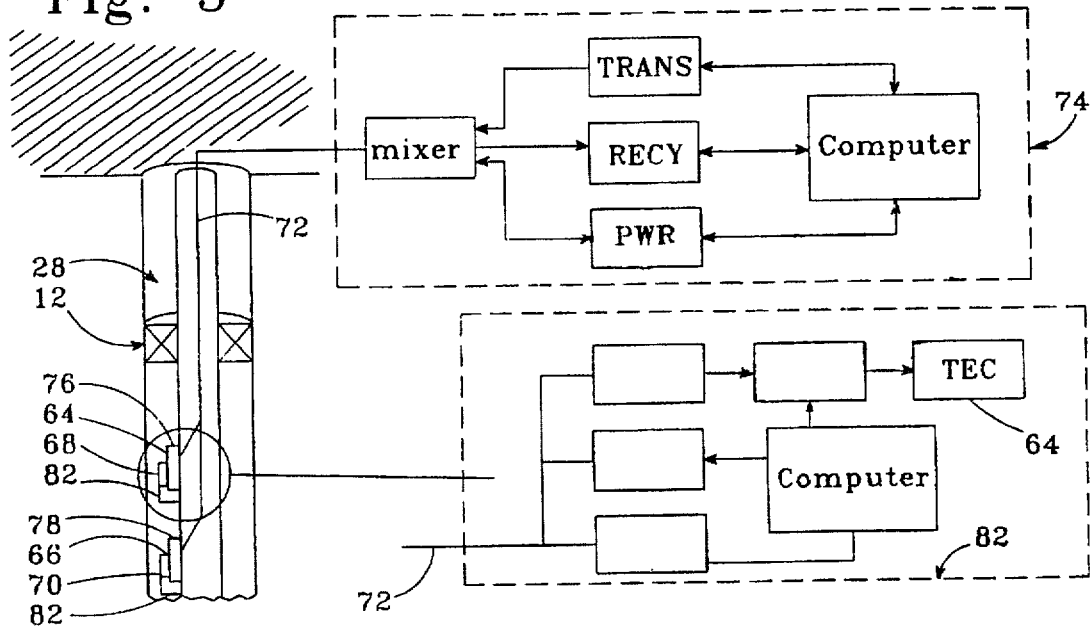
FIG. 5 illustrates a schematic view of the invention showing two thermal electric coolers.

FIG. 5 illustrates an alternative embodiment of the invention wherein multiple TEC's are combined in a cooling system. TEC 64 and TEC 66 are located proximate to PCBAs 68 and 70 respectively. Electrified conductor or wire 72 is connected to TEC 64 and TEC 66 and extends to the well surface. Controller 74 is located at the well surface and communicates with TEC 64 and TEC 66. Controller 74 also communicates with temperature gauge 76 and temperature gauge 78 which are respectively positioned to detect the temperatures of PCBAs 68 and 70. Although the signal communication between controller 74 and TEC's 64 and 66 and temperature gauges 76 and 78 is illustrated as being accomplished through wire 72 which can comprise an instrument wire ("I wire") in one embodiment, it will be appreciated that such communication can be accomplished through different techniques known in the art. In one embodiment of the invention, either wire 72 or other type of conductor can simultaneously transmit signals and to transmit power for operation of TECs and other downhole equipment.

The conductive capability of wire 72 is limited by the resistance per length of wire. The voltage drop across the resistance of the wire increases with the square of the current. The present invention manages this limitation by controlling the amount of power supplied to one or more thermal converters or other power device. As shown in FIG. 5, voltage is measured at end of wire 72 by downhole controllers 82. Downhole controllers 82 are in communication with controller 74 at the surface and can communicate voltage value. Downhole controllers 82 can also modulate power to TECs 64 and 66. In one embodiment of the invention, downhole controllers 82 increase power to TECs 64 and 66 until voltage at end of wire 72 decreases below a critical level.

In one form of the embodiment shown in FIG. 5, two or more downhole controllers 82 can be engaged with TECs 64 and 66 at different parts of the well. Because each of the downhole controllers 82 may require different thermal energy levels to sustain PCBAs 68 and 70 at selected temperatures, controller 74 can modulate the power to each downhole controller 82.

Temperature gauges 76 and 78 monitor the temperature of PCBAs 68 and 70 and communicate such information to controller 74. This temperature information is processed and a control signal is sent by controller 74 to TECs 64 and 66. If TEC 66 is connected to wire 72 at a location more distant from controller 74 than TEC 64, and if the temperature desired for PCBA 68 and PCBA 70 is the same, TEC 66 will require a higher percentage of the total power transmitted through wire 72 than will TEC 64.

In another embodiment, controller 74 can iteratively measure the temperature of each PCBA and selectively modify the power supplied to each TEC until the desired condition is reached. Under this embodiment, controller 74 can actively search for the optimal cooling power while limiting the total amount of power transmitted through wire 72. In one configuration of this embodiment, each PCBA would measure the voltage potential at the respective TEC and then transmit such data to controller 74. Each PCBA would also modulate the amount of power into the respective TEC. Controller 74 would supply the maximun permissible voltage to wire 72, and would request each PCBA to report the voltage data experienced. Controller 74 would then compare the respective voltages. If the voltage is above the drop out voltage, controller 74 would then increase the power to the TECs by a selected factor and would repeat the process described above. By repeating this process, the maximum amount of power that can be managed by the entire system can be determined and tested.

In a system having two or more TECs or other thermal converters, each TEC will likely experience a different ambient temperature within the wellbore. Each PCBA can have the capability described above in addition to other capabilities. For example, each PCBA could measure the voltage of the hot and cold surfaces of each TEC, could transmit such data to controller 74, and could be capable of modulating the power to the respective TEC. Controller 74 could read the cold side temperature and the voltage at each TEC. If the PCBA drop out voltage is known, controller 74 could instruct the PCBA with the highest TEC temperature to increase the power to the TEC by a selected amount until the temperature is below the temperature of the other TEC. Conversely, the process could be repeated for the new TEC having the highest temperature. In this fashion, the overall power distributed through wire 72 substantially remains constant at the maximum level while the temperature of each TEC is reduced to the greatest extent possible.

In another embodiment of the invention, the selective operation of each PCBA and TEC could be controlled independently of temperature requirements. For example, it may be desirable to selectively activate or interrupt the supply of power to a selected TEC, and controller 74 could be programmed to accomplish this task.

The present invention extends the life span of selected electronic components by lowering the temperature of such components and by lowering the junction temperature between such components and other elements in the system. By providing an efficient thermal conductivity path, the invention efficiently cools the electronic components with a minimal amount of power.

The invention further permits the efficient allocation of a limited power source to a single thermal converter or to a combination of thermal converters. This feature balances the cooling operation of the entire tool string while preventing disruptions to the power source and transmission system. In different embodiments of this feature, the temperatures of selected tools or electronic components in tools can be monitored and adjusted to meet desired operational parameters. Consequently, the available power can be transmitted to control the efficient operation of a single component or of several components in the well string.

Although the present invention is particularly, useful in high temperature wells, the invention concepts are useful in applications requiring extended tool service over a long production life, or in applications where the repair costs of replacing failed components substantially exceed the preventative maintenence cost of the system.

Although the invention has been described in terms of certain preferred embodiments and procedures, it will be apparent to those of ordinary skill in the art that various modifications and improvements can be made to the inventive concepts herein without departing from the scope of the invention. The embodiments described herein are merely illustrative of the inventive concepts and should not be interpreted as limiting the scope of the invention.

What is claimed is:

1. An apparatus engaged with an electric power source for extending the life span of an electronic component in a well, comprising:

a housing defining an interior space within the well, wherein a vacuum is maintained within said interior space;

a connecter for engagement with the electric power source; and a converter located within said housing interior space, wherein said converter is engaged with said connecter for transforming power from the electric power source into thermal energy to create a cold surface for cooling the electronic components, and to create a hot surface for dissipating thermal energy away from said converter.

2. An apparatus as recited in claim 1, wherein the electronic component is positioned within said housing interior space.

* * * * *